(12) United States Patent
Ogata et al.

(10) Patent No.: US 8,041,534 B2
(45) Date of Patent: Oct. 18, 2011

(54) SENSOR DEVICE, AND SENSOR SYSTEM AND ELECTRONIC DEVICE USING THE SENSOR DEVICE

(75) Inventors: Masako Ogata, Yokohama (JP); Kazuhiro Suzuki, Tokyo (JP); Hideyuki Funaki, Tokyo (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 12/234,732

(22) Filed: Sep. 22, 2008

(65) Prior Publication Data
US 2009/0086879 A1    Apr. 2, 2009

(30) Foreign Application Priority Data
Sep. 26, 2007  (JP) .................. 2007-249506

(51) Int. Cl.
*G01R 15/00* (2006.01)
*G01R 23/00* (2006.01)
*G01R 19/00* (2006.01)
(52) U.S. Cl. .......................... 702/150; 702/57; 324/661
(58) Field of Classification Search .............. 702/57, 702/150; 324/658, 660, 661, 662, 686; 73/1.79, 73/1.81, 514.32
See application file for complete search history.

(56) References Cited

U.S. PATENT DOCUMENTS

| | | | | |
|---|---|---|---|---|
| 4,070,582 | A * | 1/1978 | Kisrow | 378/187 |
| 5,406,848 | A * | 4/1995 | Okada | 73/514.32 |
| 5,861,754 | A * | 1/1999 | Ueno et al. | 324/660 |
| 7,119,550 | B2 * | 10/2006 | Kitano et al. | 324/658 |
| 7,391,411 | B2 * | 6/2008 | Morimoto et al. | 345/161 |
| 7,456,637 | B2 * | 11/2008 | Canegallo et al. | 324/662 |
| 7,876,105 | B2 | 1/2011 | Ogata et al. | |
| 2008/0181353 | A1 | 7/2008 | Ogata et al. | |

FOREIGN PATENT DOCUMENTS

| | | |
|---|---|---|
| JP | 2003-043078 | 2/2003 |
| WO | 2004/059343 | 7/2004 |

* cited by examiner

*Primary Examiner* — Michael Nghiem
*Assistant Examiner* — Ricky Ngon
(74) *Attorney, Agent, or Firm* — Turocy & Watson, LLP

(57) ABSTRACT

A sensor device which detects a positional relationship between an first member and second member, includes a signal source generating an electrical signal, a first electrode receiving the electrical signal and storing an electrical charge at a first part on the first member, a second electrode inducing an electrical charge at the second part on the second member, a third electrode inducing an electrical charge at the third part on the second member, a fourth electrode inducing an electrical charge at the fourth part on the first member, a reference electrode disposed at a fifth part on the second member to be connected to a reference voltage point, a fifth electrode inducing an electrical charge at the sixth part on the first member, and a differential amplifier amplifying a voltage difference between the fourth electrode and the fifth electrode and outputting a difference signal.

17 Claims, 11 Drawing Sheets

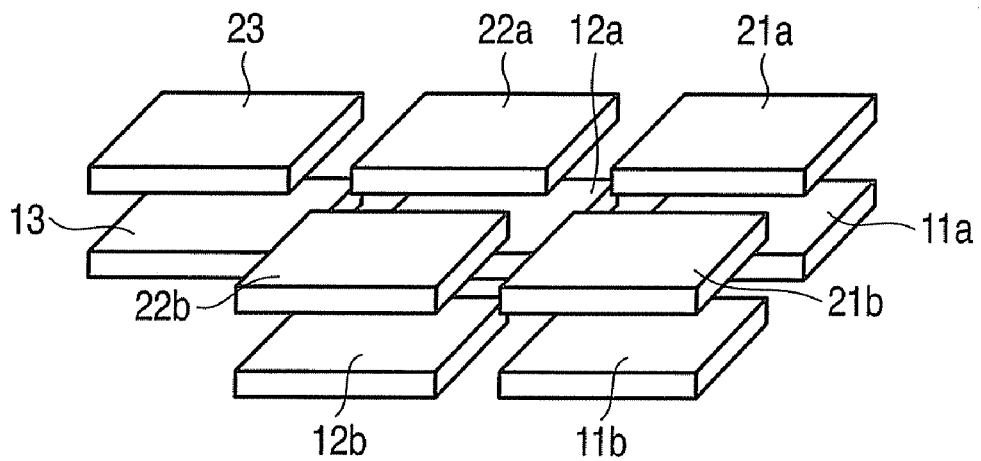
F I G. 7
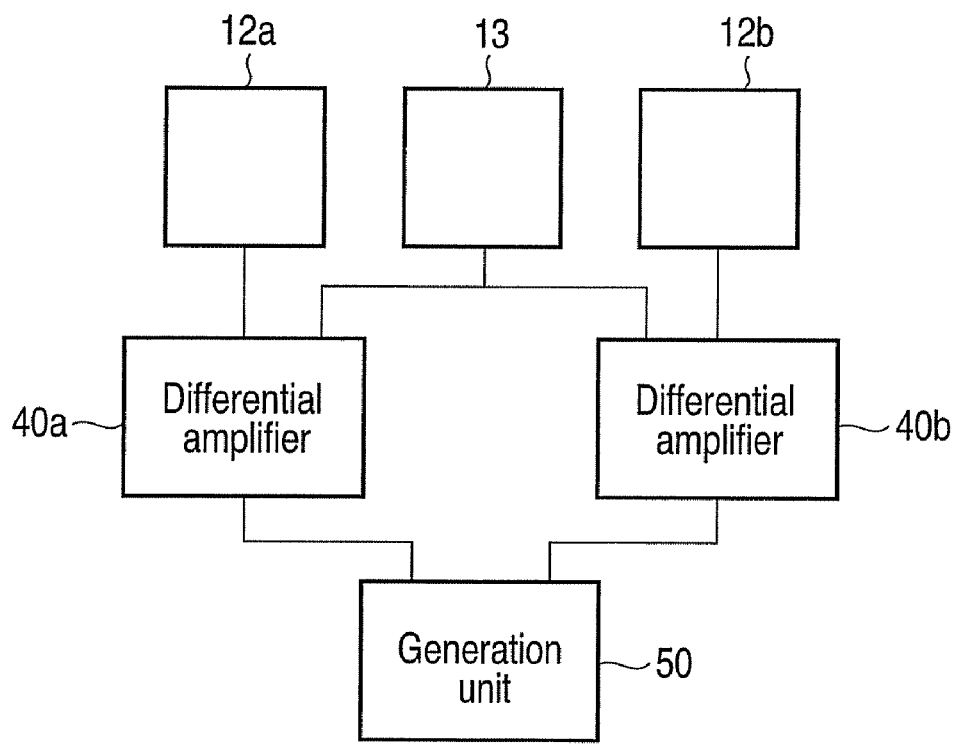
F I G. 8

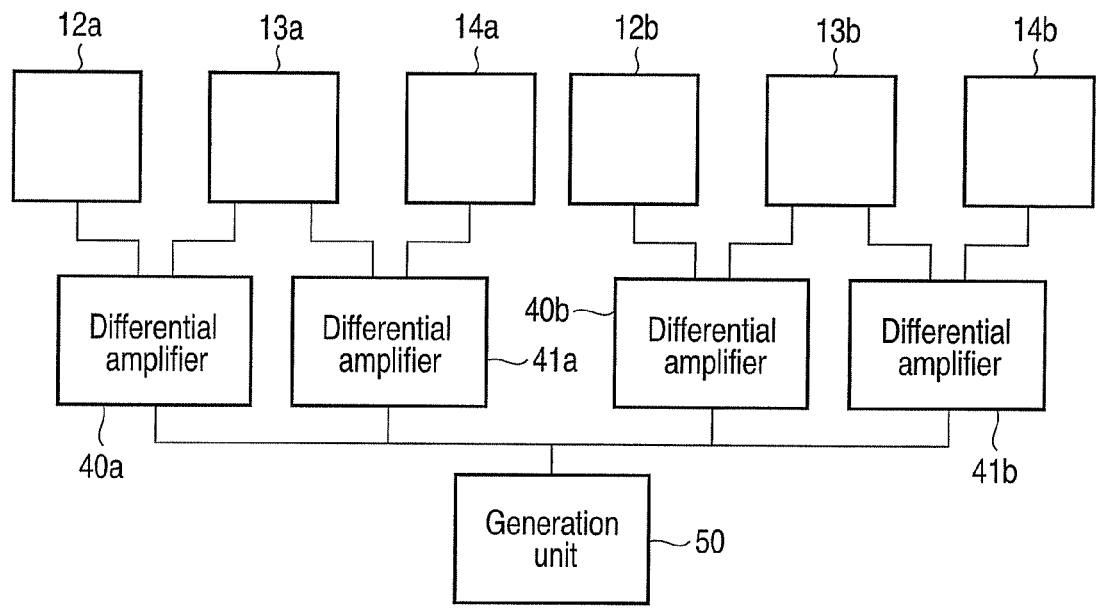
F I G. 11
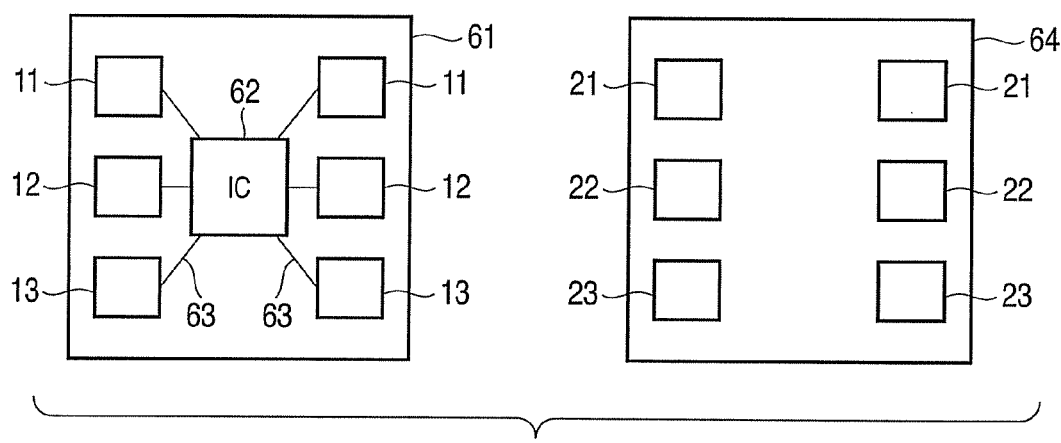
F I G. 12

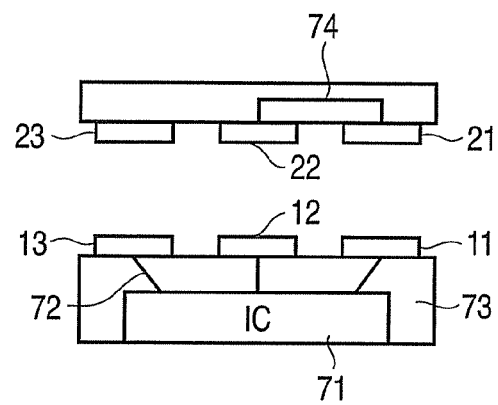
F I G. 13
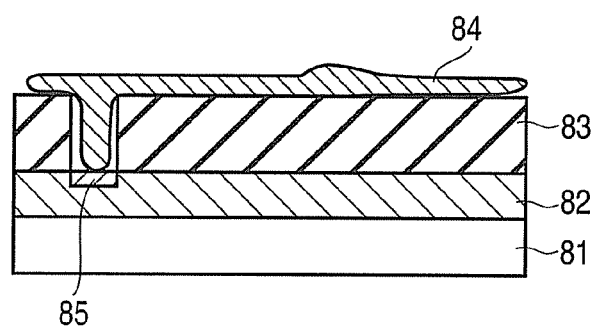
F I G. 14
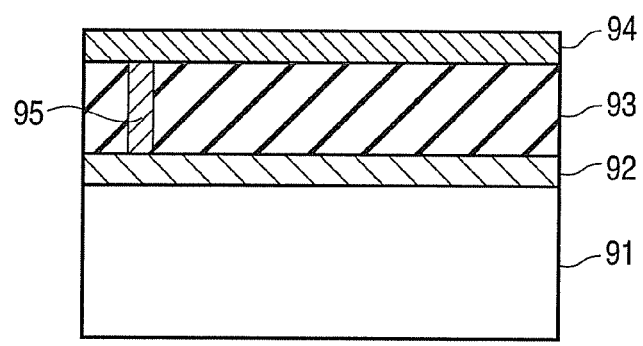
F I G. 15

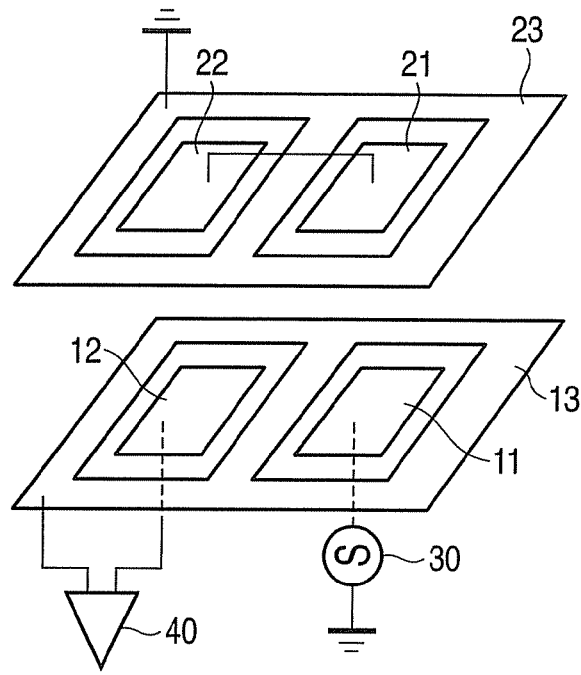
F I G. 23
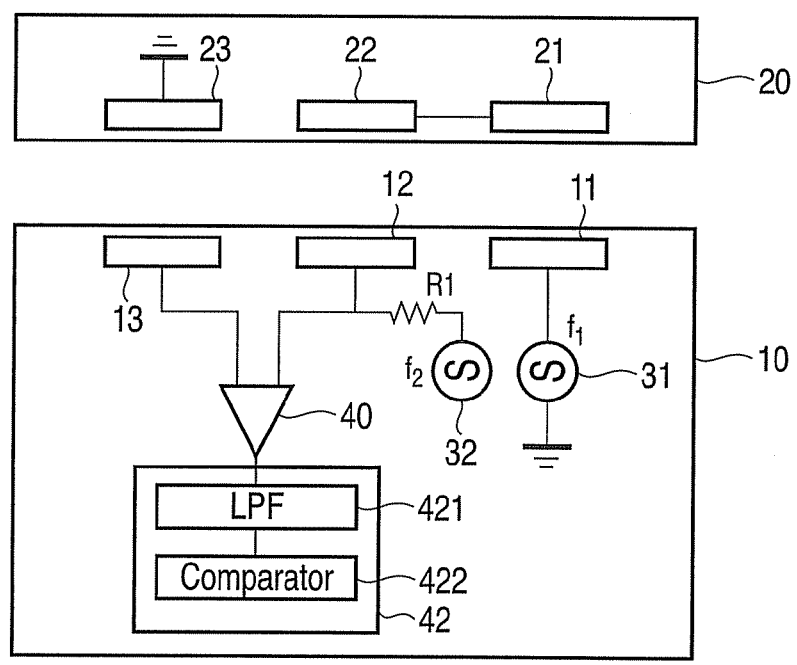
F I G. 24

SENSOR DEVICE, AND SENSOR SYSTEM AND ELECTRONIC DEVICE USING THE SENSOR DEVICE

CROSS-REFERENCE TO RELATED APPLICATIONS

This application is based upon and claims the benefit of priority from prior Japanese Patent Application No. 2007-249506, filed Sep. 26, 2007, the entire contents of which are incorporated herein by reference.

BACKGROUND OF THE INVENTION

1. Field of the Invention

The present invention relates to a sensor device, and a sensor system and an electronic device using the sensor device.

2. Description of the Related Art

In recent years, a proximity sensor of this kind detecting electrostatic capacitance has been proposed as a sensor detecting proximity of an object (e.g., refer to International Publication WO2004/059343). Such a proximity sensor includes a first member to detect proximity and a second member to be a detection object, and can detect the proximity of the second member in a non-contact manner.

However, the proximity sensor disclosed in International Publication WO2004/059343 given above basically detects all objects approaching the first member. Therefore, it is hard to detect only the second member. For instance, if the second member is a tab or a door, the proximity sensor should detect the proximity only of the tab or the door, but the proximity sensor actually detects the proximity of an object other than the tab or the door.

As mentioned above, it is hard for a conventional proximity sensor to accurately detect the proximity only of an object to be detected.

BRIEF SUMMARY OF THE INVENTION

According to one embodiment of the present invention, there is provided a sensor device which detects a positional relationship between an insulating first member and second member of which the surfaces face each other in coming close to each other, comprising: a first signal source generating an electrical signal; a first electrode disposed at a first part on a surface of the first member to receive the electrical signal and store an electrical charge at the first part; a second electrode disposed at a second part on a surface of the second member and inducing an electrical charge, corresponding to the electrical charge stored in the first part, at the second part when the first electrode approaches; a third electrode disposed at a third part on a surface of the second member, connected to the second electrode, and inducing an electrical charge, corresponding to the electrical charge induced at the second part, at the third part; a fourth electrode disposed at a fourth part on a surface of the first member and inducing an electrical charge, corresponding to the electrical charge induced at the third part, at the fourth part when the third electrode approaches; a reference electrode disposed at a fifth part on a surface of the second member to be connected to a reference voltage point; a fifth electrode disposed at a sixth part on a surface of the first member, and inducing an electrical charge, corresponding to the electrical charge to be stored in the fifth part, at the sixth part when the reference electrode approaches; and a differential amplifier amplifying a voltage difference between the fourth electrode and the fifth electrode and outputting a difference signal corresponding to the positional relationship.

According to one embodiment of the present invention, there is provided an electronic device, comprising a first member, a second member and a sensor device which detects a positional relationship between the first and the second members, wherein the sensor device comprises: a first signal source generating an electrical signal; a first electrode disposed at a first part on a surface of the first member to receive the electrical signal and store an electrical charge at the first part; a second electrode disposed at a second part on a surface of the second member and inducing an electrical charge, corresponding to the electrical charge stored in the first part, at the second part when the first electrode approaches; a third electrode disposed at a third part on a surface of the second member, connected to the second electrode, and inducing an electrical charge, corresponding to the electrical charge induced at the second part, at the third part; a fourth electrode disposed at a fourth part on a surface of the first member and inducing an electrical charge, corresponding to the electrical charge induced at the third part, at the fourth part when the third electrode approaches; a reference electrode disposed at a fifth part on a surface of the second member to be connected to a reference voltage point; a fifth electrode disposed at a sixth part on a surface of the first member, and inducing an electrical charge, corresponding to the electrical charge to be stored in the fifth part, at the sixth part when the reference electrode approaches; and a differential amplifier amplifying a voltage difference between the fourth electrode and the fifth electrode and outputting a difference signal corresponding to the positional relationship.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7 is a schematic view depicting a modified example of the electrode arrangement of the sensor device of FIG. 1;

FIG. 8 is a block diagram depicting a configuration example of a circuit to be applied to the sensor device of FIG. 7;

FIG. 11 is a block diagram depicting a configuration example of a circuit to be applied to the sensor device of FIG. 10;

FIG. 12 is a schematic view depicting a concrete configuration example of the sensor device of the first embodiment;

FIG. 13 is a schematic view depicting a concrete configuration example of the sensor device of the first embodiment;

FIG. 14 is a schematic view depicting a concrete configuration example of the sensor device of the first embodiment;

FIG. 15 is a schematic view depicting a concrete configuration example of the sensor device of the first embodiment;

FIG. 23 is a schematic view depicting a configuration of the second embodiment of the sensor device regarding the present invention; and FIG. 24 is a schematic view depicting a configuration of the third embodiment of the sensor device regarding the present invention.

DETAILED DESCRIPTION OF THE INVENTION

First Embodiment

Hereinafter, the first embodiment of the present invention will be described with reference to the drawings.

Figure 1:
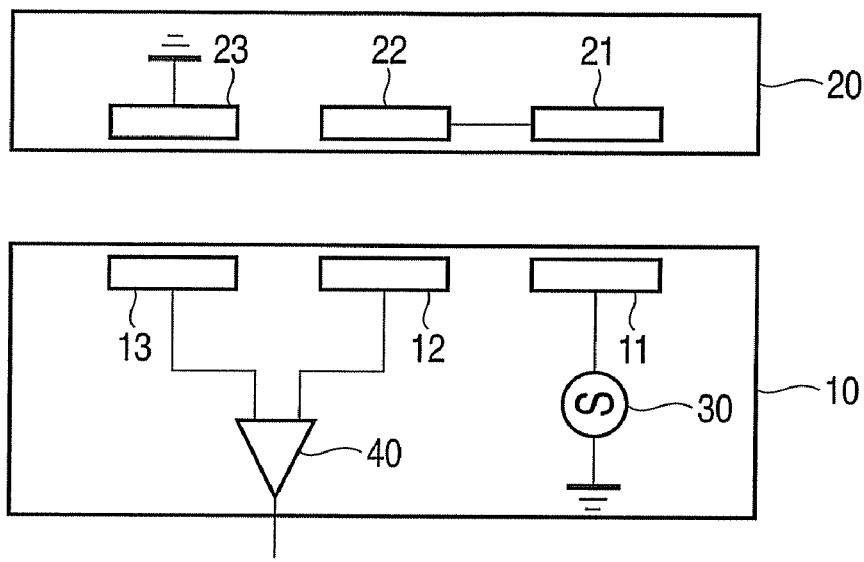
FIG. 1 is a schematic view depicting a configuration of the first embodiment of a sensor device regarding the present invention.

FIG. 1 shows a schematic view illustrating a configuration of a sensor device regarding the first embodiment of the invention. The sensor device shown in FIG. 1 detects a positional relationship between insulating first member 10 and a second member 20, that is, detects whether the members 10, 20 are in proximity to each other or apart from each other.

In the first member 10, a first electrode 11 to transmit a signal, a first electrode 12 to detect a signal and a second electrode 13 to detect a signal are arranged adjacently to each other. An alternating-current power source 30 is connected to the electrode 11, and an electrical charge is supplied to the electrode 11 from the power source 30. Here, although the alternating-current power source 30 is utilized, a fixed electrical charge or a direct-current power source may be used in response to use or detection precision.

On the second member 20, a second electrode 21 to transmit a signal, a third electrode to transmit a signal, and an electrode 23 to store a reference electrical charge are arranged adjacently to each other. The electrodes 21, 22 are short-circuited. The electrode 23 is grounded.

When the members 10, 20 are close to each other, the electrodes 11, 21, the electrodes 12, 22 and the electrodes 13, 23 face each other, respectively. That is, if the members 10, 20 are brought into a state where they are close to each other from a state where they are apart from each other, the electrodes 11, 21 come close to each other, the electrodes 12, 22 come close to each other, and the electrodes 12, 23 come close to each other.

As a result, an electrical charge corresponding to an electrical charge stored in an installation part of the electrode 11 on the member 10 is induced at an installation part of the electrode 21 on the member 20. When the electrical charge is induced at an installation part of the electrode 21, since the electrode 21 is short-circuited to the electrode 22, an electrical charge corresponding to the electrical charge to be stored at the installation part of the electrode 21 is induced at an installation part of the electrode 22 on the member 20. When the electrical charge is induced at the installation part of the electrode 22, at an installation part of the electrode 12 on the member 10, an electrical charge corresponding to the electrical charge to be stored at the installation part of the electrode 22 is induced. An installation part of the electrode 13 on the member 10 is grounded by the approach to the grounded electrode 23. Therefore, electrical charges which are different from each other are induced at the installation parts of the electrodes 12, 13 on the member 10.

A differential amplifier 40 is connected to the electrodes 12, 13. In a case of a state in which the members 10, 20 are in proximity to each other, since a electrical potential difference between the electrodes 12, 13, namely an electrical potential difference between two input terminals of the amplifier 40, is amplified, a large difference signal is output from the amplifier 40. Meanwhile, if the members 10, 20 are in a state in which they are apart from each other, since the electrical potential difference between the electrodes 12, 13 is equivalent to zero (or almost zero), the difference signal output from the amplifier 40 is equivalent to zero (or almost zero).

In a state in which the members 10, 20 are in proximity to each other, distances between the electrodes 11, 21, the electrodes 12, 22, and the electrodes 13, 23 are vary, respectively, in response to devices to which the sensor devices are applied. The electrical charges to be induced at the installation parts of the electrodes 12, 21 vary in response to the distance between the electrodes 11, 21 and the distance between the electrodes 12, 22. Therefore, it is preferable for the electrical charge to be stored in the installation part of the electrode 11 to be made variable so as to enable optimum detection corresponding to the device to which the sensor device is applied. More specifically, it is preferable to make the alternating-current power source 30 be a variable voltage power source. Making the electrical charge to be stored at the installation part of the electrode 11 variable enables performing accurate sense adjustment and improving detection precision.

From a point of view of performing accurate sense adjustment, it is also preferable to make the gain of the amplifier 40 variable.

From a point of view enhancing detection sensitivity, it is also preferable to dispose an amplification circuit between the electrode 12 and the amplifier 40.

It is also able to utilize the difference signal output from the amplifier 40 as a binary logical signal. That is, as the difference signal output from the amplifier 40 is equivalent to zero (or almost zero) in a case where the members 10, 20 are apart from each other, the sensor device utilizes the difference signal as a state of logical value '0'. Conversely, as the large difference signal is output from the amplifier 40 in a case where the members 10, 20 are in proximity to each other, the sensor device utilizes the difference signal as the logical value '1'.

Figure 2:
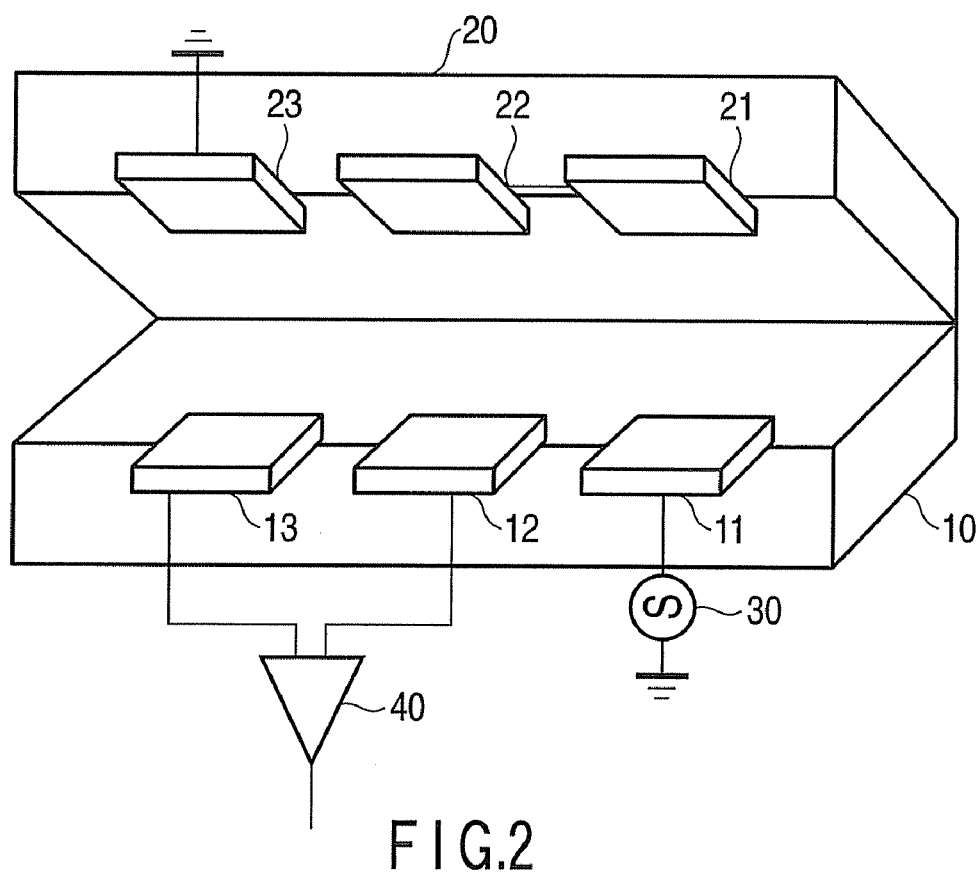
FIG. 2 is a schematic view in a case in which the sensor device of FIG. 1 is mounted on various switching devices.

FIG. 2 shows a schematic view illustrating a mounting of an electrode arrangement in a case in which the sensor device of the first embodiment regarding the invention is mounted on various switching devices. The electrodes 11, 12, 13 are disposed adjacently to each other on the surface of the first member 10. The electrodes 21, 22, 23 are disposed adjacently to each other on the surface of the second member 20.

When the first member 10 and the second member 20 are in a closed state, the electrodes 11, 21, the electrodes 12, 22 and the electrodes 13, 23 face each other, respectively. In other words, if the members 10, 20 shift from an open state to a closed state, the electrodes 11, 21, the electrodes 12, 22 and the electrodes 13, 23 come close to each other, respectively.

The sensor devices in the examples shown in FIGS. 1 and 2 include one electrode to transmit a signal and two electrodes to detect signals, and further include two electrodes to transmit a signal to the member 20 and one electrode to store a reference electrical charge. However, the sensor device can include two or more electrodes to transmit signals to the member 10 and two or more electrodes to detect signals, and three or more electrodes to transmit signals to the member 20 and two or more electrodes to detect signals. Hereinafter, a concrete example will be described.

Figure 3:
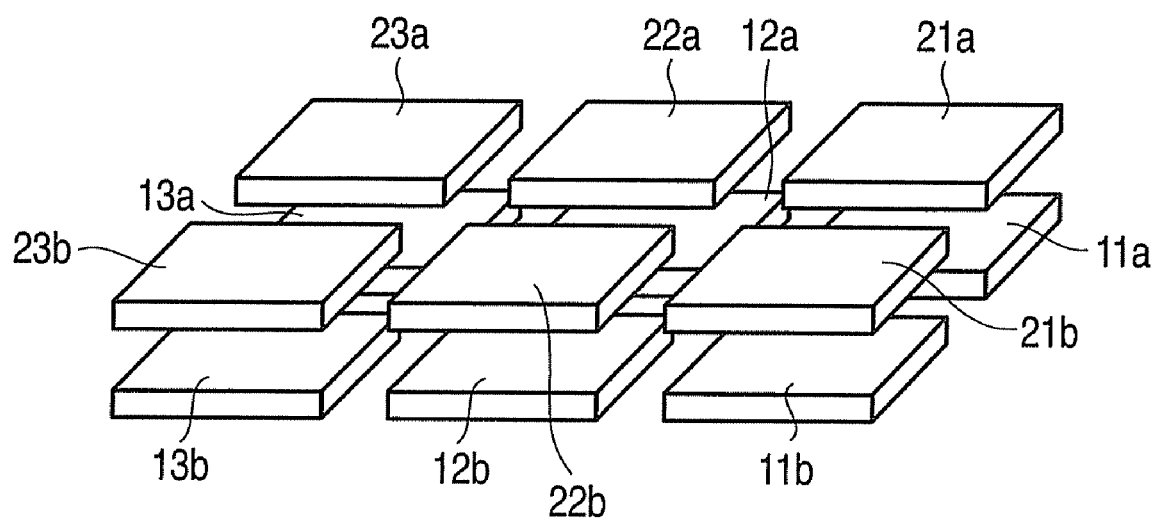
FIG. 3 is a schematic view depicting a modified example of an electrode arrangement of the sensor device 1 of FIG. 1.
Figure 4:
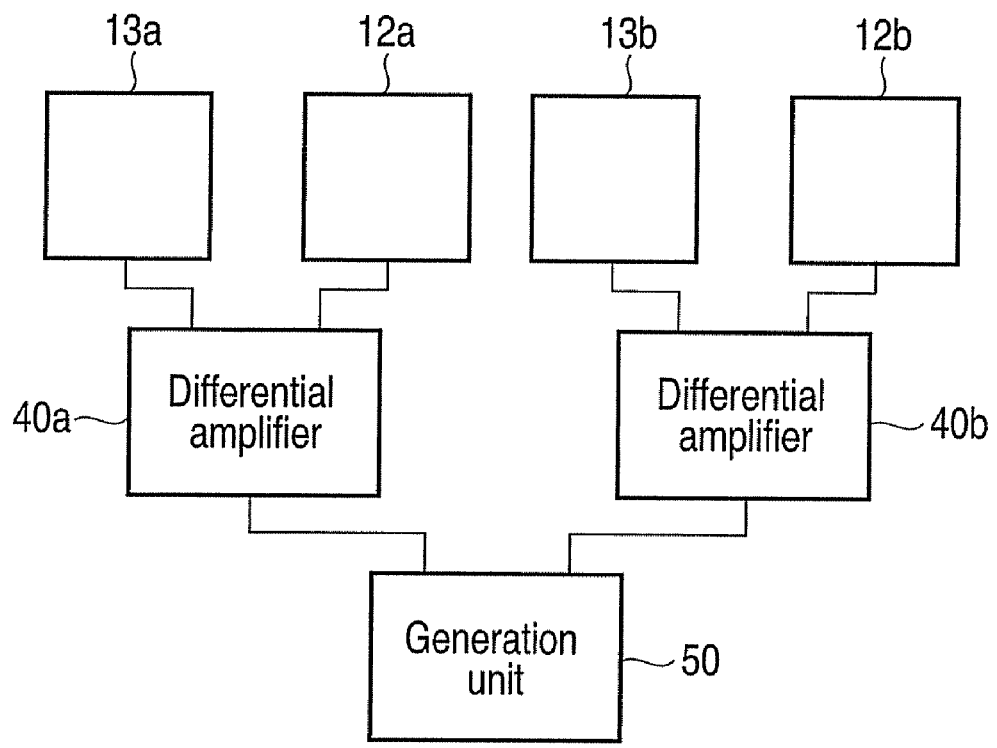
FIG. 4 is a block diagram depicting a configuration example of a circuit to be applied to the sensor device of FIG. 3.

FIGS. 3 and 4 show examples in which more than one detection unit (electrodes 11, 12, 13 provided for member 10, electrodes 21, 22, 23 provided for member 20 and a differential amplifier 40) shown in FIG. 1 is included. FIG. 3 shows an electrode arrangement, and FIG. 4 shows a circuit configuration.

As shown in FIGS. 3 and 4, a first detection unit is composed of electrodes 11a, 12a, 13a, electrodes 21a, 22a, 23a and a differential amplifier 40a. A second detection unit is composed of electrodes 11b, 12b, 13b, electrodes 21b, 22b, 23b and a differential amplifier 40b. The differential amplifiers 40a, 40b are connected to a generation unit 50 generating an output signal. An example of the generation unit 50 will be described hereinafter.

In a first example, the generation unit 50 generates an output signal when all the differential amplifiers generate difference signals. That is, the generation unit 50 functions as an AND circuit. In the example shown in FIGS. 3 and 4, when all the differential amplifiers 40a, 40b generate the difference signals, the generation unit 50 generates the output signal. With such a configuration adopted, an incorrect operation can be prevented. Therefore, it becomes possible for the sensor device to accurately detect the approach of a detection object.

In a second example, the generation unit 50 generates an output signal when at least one differential amplifier generates a difference signal. That is, the generation unit 50 functions as an OR circuit. In the examples shown in FIGS. 3 and 4, when at least any one of the differential amplifiers 40a, 40b generates the difference signal, the generation unit 50 generates the output signal. By adopting such a configuration, even in a case in which one detection unit can perform a normal detection operation while the other detection unit cannot perform a normal detection operation, the whole sensor device can retain the normal detection operation. Therefore the sensor device can become able to accurately detect the proximity of the detection object.

Figure 5:
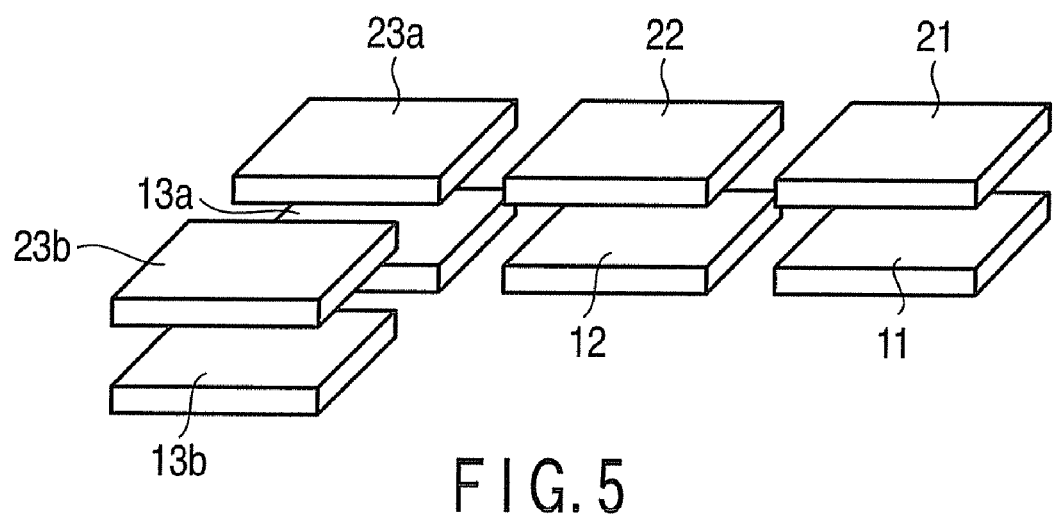
FIG. 5 is a schematic view depicting a modified example of the electrode arrangement of the sensor device of FIG. 1.
Figure 6:
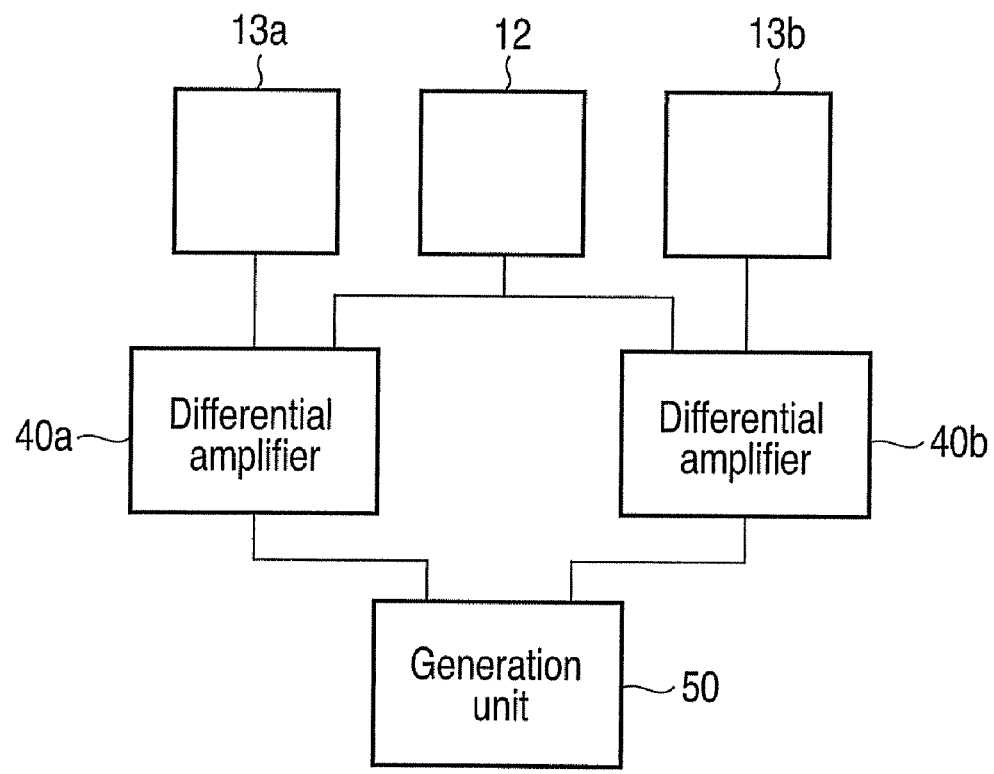
FIG. 6 is a block diagram depicting a configuration example of a circuit to be applied to the sensor device of FIG. 5.

FIGS. 5 and 6 also show examples in which more than one detection unit (electrodes 11, 12, 13 provided for member 10, electrodes 21, 22, 23 provided for member 20 and differential amplifier 40) shown in FIG. 1 is included.

As shown in FIGS. 5 and 6, electrodes 11, 12, 13a, electrodes 21, 22, 23a and a differential amplifier 40a compose one detection unit, and electrodes 11, 12, 13b, electrodes 21, 22, 23b and a differential amplifier 40b compose another detection unit. The differential amplifiers 40a, 40b are connected to the generation unit 50. The generation unit 50 operates in the same manner as the examples described for FIGS. 3 and 4. That is, the generation unit 50 can function as an AND circuit or an OR circuit. Thus the sensor device can obtain the same effects as those of the examples described for FIGS. 3 and 4 may be produced.

Further, FIGS. 7 and 8 also show examples in which more than one detection unit (electrodes 11, 12, 13 provided for member 10, electrodes 21, 22, 23 provided for member 20 and differential amplifier 40) shown in FIG. 1 is included. FIG. 7 shows an electrode arrangement, and FIG. 8 shows a circuit configuration.

As shown in FIGS. 7 and 8, electrodes 11a, 12a, 13, electrodes 21a, 22a, 23 and a differential amplifier 40a compose one detection unit, and electrodes 11b, 12b, 13, electrodes 21b, 22b 23 and a differential amplifier 40b compose another detection unit. The differential amplifiers 40a, 40b are connected to the generation unit 50. The generation unit 50 operates in the same manner as those of examples described for FIGS. 3 and 4. That is, the generation unit 50 can function as an AND circuit and an OR circuit. Thus the sensor device can obtain the same effects as those of the examples described for FIGS. 3 and 4.

Figure 9:
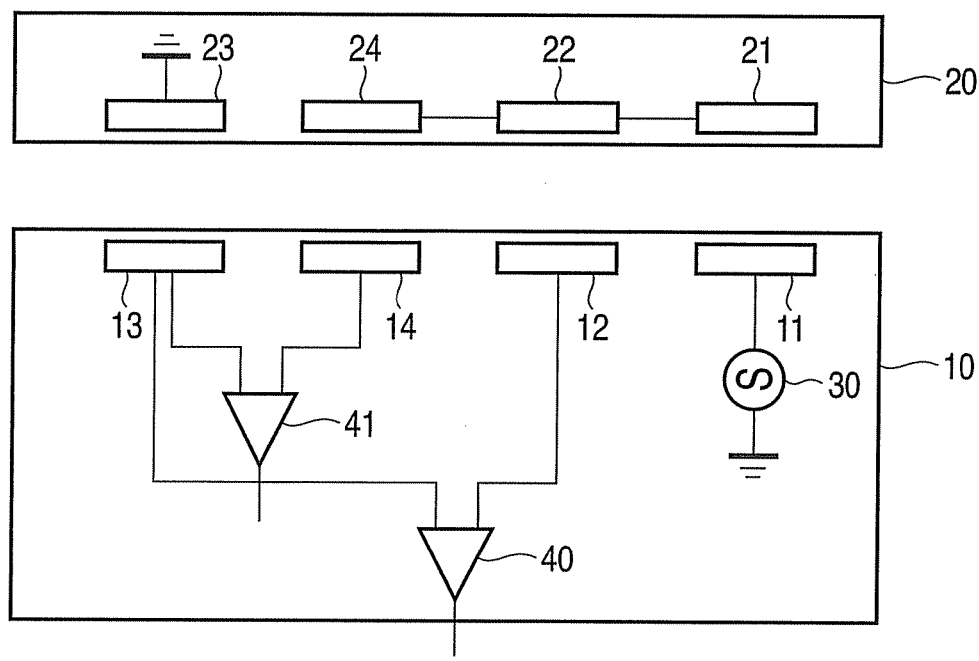
FIG. 9 is a schematic view depicting a modified example of a configuration of the sensor device of FIG. 1.

The detection unit shown in FIG. 1 can be operated similarly by the same configuration as that of FIG. 9. On the first member 10, the electrodes 11, 12, 13 and the third electrode 14 to detect the signal are arranged adjacently to each other. An alternating-current power source 30 is connected to the electrode 11, and the power source 30 supplies an electrical charge to the electrode 11. A differential amplifier 40 is connected to the electrodes 12, 13. A second differential amplifier 41 is connected to the electrodes 13, 14.

Electrodes 21, 22, 23 and a fourth electrode 24 to transfer a signal are disposed adjacently to each other on a second member 20. The electrodes 21, 22, 23 are short-circuited. The electrode 23 is grounded.

In a case in which the members 10, 20 are in proximity to each other, the electrodes 11, 21, the electrodes 12, 22, the electrodes 14, 24 and the electrodes 13, 24 face each other, respectively. That is, when the members 10, 20 shift from a separation state to a proximity state, the electrodes 11, 21 come close to each other, the electrodes 12, 22 come close to each other, the electrodes 14, 24 come close to each other, and the electrodes 13, 23 come close to each other.

Figure 10:
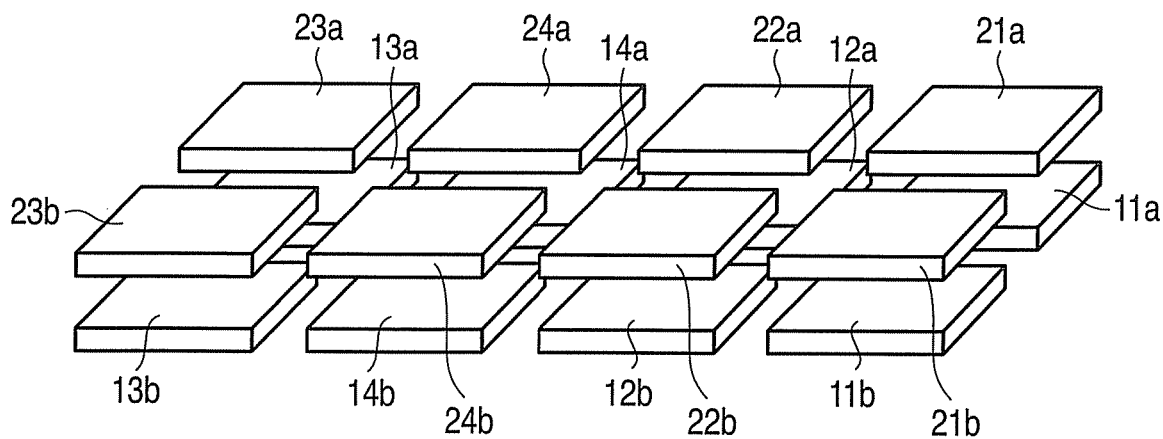
FIG. 10 is a schematic view depicting an arrangement example of electrodes of the sensor device of FIG. 9.

FIGS. 10 and 11 show examples in which more than one detection unit (electrodes 11, 12, 13, 14 provided for member 10, electrodes 21, 22, 23, 24 provided for member 20, differential amplifier 40 and second differential amplifier 41) shown in FIG. 9 is included. FIG. 10 shows an electrode arrangement, and FIG. 11 shows a circuit configuration.

As shown in FIGS. 10 and 11, electrodes 11a-14a, electrodes 21a-24a and differential amplifiers 40a, 41a compose one detection unit, and electrodes 11b-14b, electrodes 21b-24b and differential amplifiers 40b, 41b compose another detection unit. The differential amplifiers 40a, 41a and differential amplifiers 40b, 41b are connected to a generation unit 50. The generation unit 50 operates in the same manner as that of examples described for FIGS. 3 and 4. That is, the generation unit 50 can function as an AND circuit or an OR circuit. Thus the sensor device can obtain the same effects as those of the example described for FIGS. 3 and 4.

Next, concrete examples of the sensor devices of FIGS. 1 and 2 of the first embodiment regarding the invention will be described.

FIG. 12 shows a plan view schematically illustrating a first configuration example of the sensor device. The left view in FIG. 12 shows a configuration example of electrodes 21, 22, 23, and the right view thereof shows configuration example of electrodes 21, 22, 23.

In the left view of FIG. 12, the electrodes 11, 12, 13 and a circuit unit 62 composed of an integrated circuit (IC) are arranged on the same substrate 61. That is, the electrodes 11, 12, 13 and the circuit unit 62 are disposed on the same plane. The circuit unit 62 includes various circuits, such as a differential amplifier 40 (refer to FIGS. 1 and 2). The electrodes 11, 12, 13 and the circuit unit 62 are connected with one another by wires 63. Arranging the electrodes 11, 12, 13 and the circuit unit 62 on the same substrate 61 (disposing on the same plane) enables realizing a compact mounting. The circuit 62 may be disposed on another substrate if necessary.

In the right view of FIG. 12, the electrodes 21, 22, 23 are arranged on the same substrate 64. That is, the electrodes 21, 22, 23 are disposed on the same plane.

The substrates 61, 64 are mounted on the foregoing members 10, 20, respectively. Thus, the electrodes 11, 12, 13 are disposed on the surface of the member 10. The electrodes 21, 22, 23 are disposed on the surface of the member 20.

FIG. 13 shows a cross-sectional view schematically illustrating a second configuration example. In the second configuration example, the electrodes 11, 12, 13 are arranged so as to cover at least a part of a circuit unit 71 composed of an IC. The circuit unit 71 includes various circuits, such as a differential amplifier 40 (refer to FIGS. 1 and 2). The electrodes 11, 12, 13 and the circuit unit 71 are connected with one another through wires 72. The circuit units 71 and the wires 72 are covered with a molded resin 73. Since the electrodes 11, 12, 13 are arranged so as to cover at least a part of the circuit unit 71, a mounting area may be reduced, and compact mounting may be achieved.

The electrodes 21, 22, 23 are, as shown in FIG. 13, disposed on the same plane which faces the electrodes 11, 12, 13, respectively. A wire 74 which connects between the electrodes 21, 22 is covered with the molded resin 73.

While the example shown in FIG. 13 has described the configuration in which the electrodes 11, 12, 13 are disposed outside a package of the molded resin 73, they may be disposed inside the package. Adopting such a configuration enables achieving further compact mounting.

FIG. 14 shows a cross-sectional view schematically illustrating a third configuration example. In the example, an electrode 84 is arranged so as to cover at least a part of the circuit unit 82, in order to transmit a signal in the member 10. More specifically, the circuit 82 is arranged on a substrate 81, and the circuit unit 82 is covered with a molded resin 83. The electrode 84 is formed on the molded resin 83 using a plating method (actually, the electrodes 12, 13 are also formed similarly). A hole is formed in the molded resin 83, and the electrode 84 and a pad 85 of the circuit unit 82 are electrically connected through the hole. Also in the embodiment, since the electrode 84 is arranged so as to cover at least a part of the circuit unit 82, a mounting area may be decreased, which enables more compact mounting.

FIG. 15 shows a cross-sectional view schematically illustrating a fourth configuration example. Also in the example, an electrode 94 to transmit a signal in the member 10 is arranged so as to cover a part of a circuit unit 92. More specifically, the circuit unit 92 is formed on a semiconductor substrate (e.g., silicon substrate) 91 by means of a usual IC forming technique to cover the circuit 92 with an insulating film 93. On the insulating film 93, the electrode 94 is formed (actually, electrodes 12, 13 are also formed similarly). A via hole is formed in the insulating film 93, and a conducting part 95 formed in the via hole electrically connects the electrode 94 to the circuit unit 92. Also in the example, since the electrode 94 is arranged so as to cover at least a part of the circuit unit 92, the sensor device can reduce a mounting area and realize compact mounting.

Figure 16:
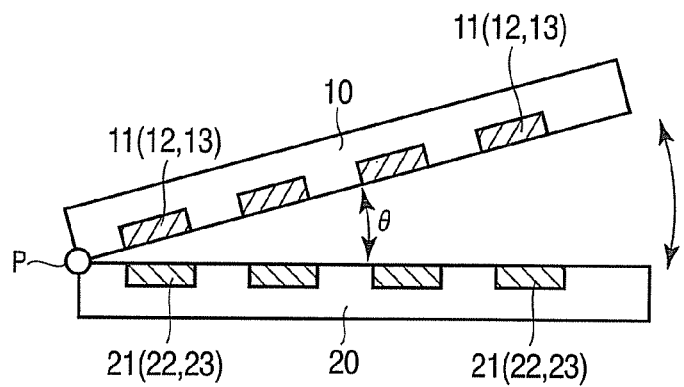
FIG. 16 is a cross-sectional view depicting an example in a case in which the sensor device of the first embodiment is used as an angle detection sensor.
Figure 17:
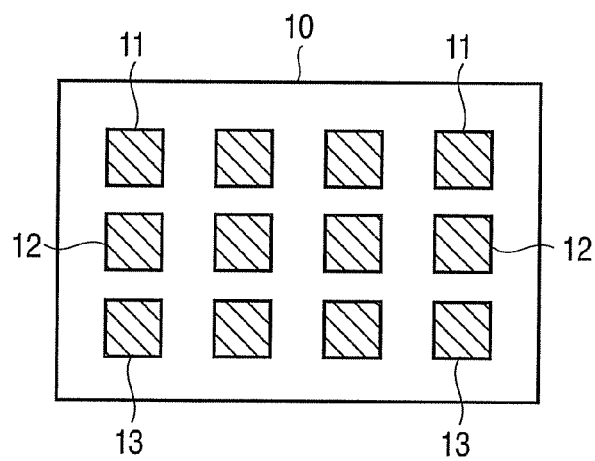
FIG. 17 is a plane view of the angle detection sensor of FIG. 16.
Figure 18:
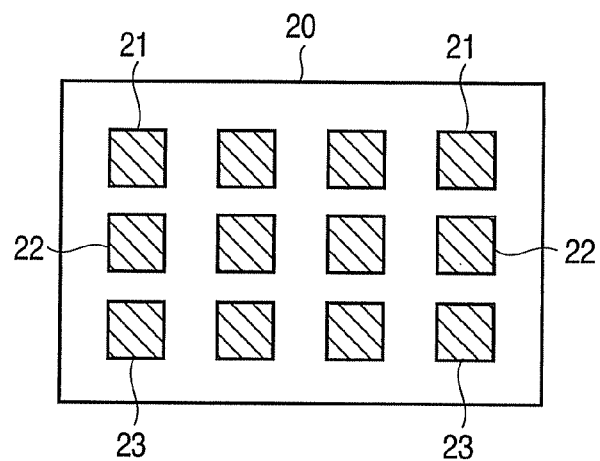
FIG. 18 is a plane view of the angle detection sensor of FIG. 16.

Each of FIGS. 16, 17 and 18 shows a schematic view illustrating an example of a case in which the sensor device of the first embodiment regarding the invention is used as an angle detection sensor. FIG. 16 shows a cross-sectional view, and FIGS. 17 and 18 show plan views.

As shown in FIGS. 16 and 17, a plurality of first electrode groups consisting of electrodes 11, 12, 13 are arranged from one end to the other end of the first member 10. Similarly, as shown in FIGS. 16 and 18, a plurality of second electrode groups consisting of electrodes 21, 22, 23 are arranged from one end to the other end of the second member 20. The one end of the first member 10 and the one end of the second member 20 are connected to each other at a connecting point P. The first and the second members 10, 20 are relatively rotatable in an arrow direction around the point P.

As can be seen in FIGS. 16, 17 and 18, as the angle $\theta$ made by the members 10, 20 becomes small, the number of the first electrode groups (electrodes 11, 12, 13) which are brought into on states (proximity detecting states) increases. Therefore, if a relationship between the on/off state of each first electrode group (electrodes 11, 12, 13) and the angle $\theta$ is obtained in advance, the on/off state of each first electrode group (electrodes 11, 12, 13) enables measuring the angle $\theta$. Therefore, increasing the number of the second electrode groups (electrodes 21, 22, 23) and the first electrode groups (electrode 11, 12, 13) enables the angle $\theta$ to be measured as an analog value, and an angle detection device can be configured with a simple configuration.

FIGS. 19-22 show configuration examples in which the sensor devices of the first embodiments regarding the inventions are applied to mobile communication terminals. As a mobile communication terminal, a cellular phone is assumed.

In FIGS. 19-22, the member 10 corresponds to a lower side member of the cellular phone, and the member 20 corresponds to an upper side member of the cellular phone. The electrodes 11, 12, 13 are arranged in an area 100 in which electrodes are arranged, and the electrodes 21, 22, 23 are arranged in an area 200 in which electrodes are arranged. The members 10, 20 each include communication function units.

Figure 19:
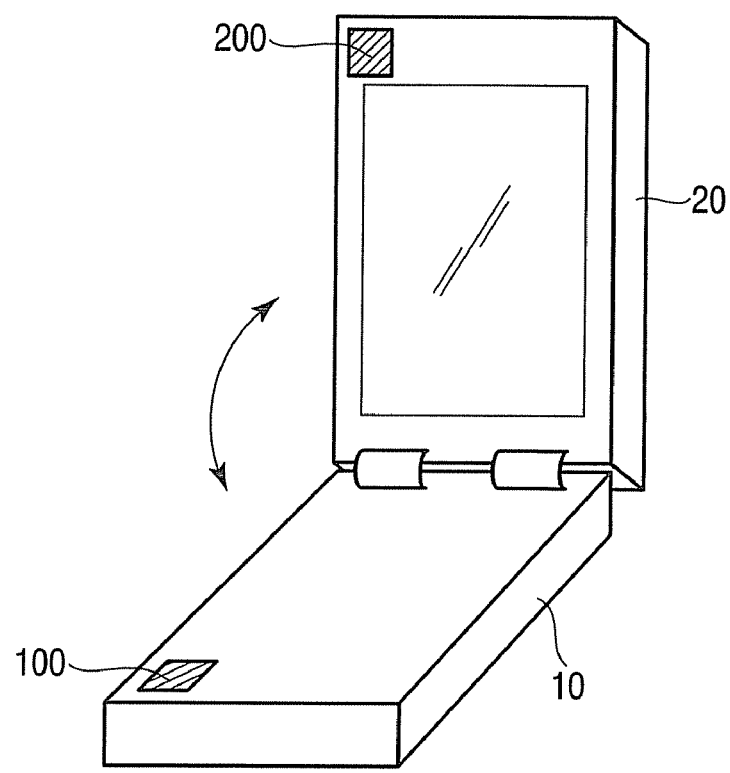
FIG. 19 is a schematic view depicting a configuration example when the sensor device of the first embodiment is applied to a mobile communication terminal.

FIG. 19 shows an open/close type cellular phone. When the members 10, 20 move in an arrow direction and the areas 100, 200 are in proximity to each other, a closed state of the members 10, 20 is detected.

Figure 20:
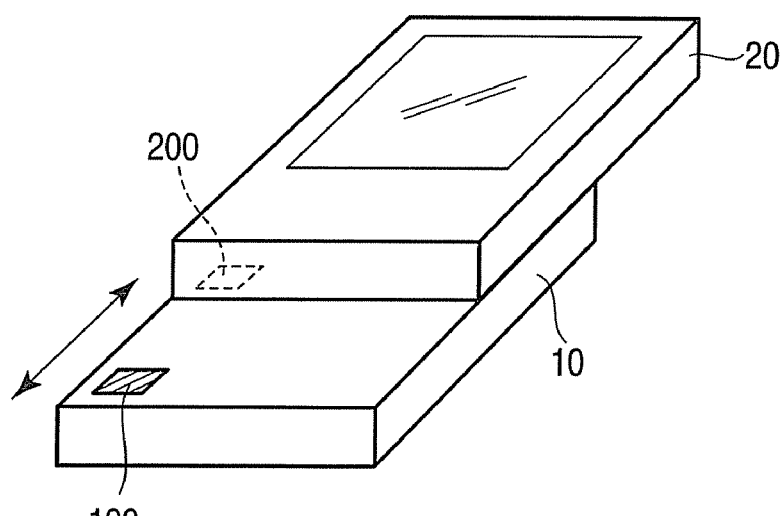
FIG. 20 is a schematic view depicting a configuration example when the sensor device of the first embodiment is applied to a mobile communication terminal.

FIG. 20 shows a slide type cellular phone. When the members 10, 20 move in an arrow direction and the areas 100, 200 are in proximity to each other, the closed state of the members 10, 20 is detected.

Figure 21:
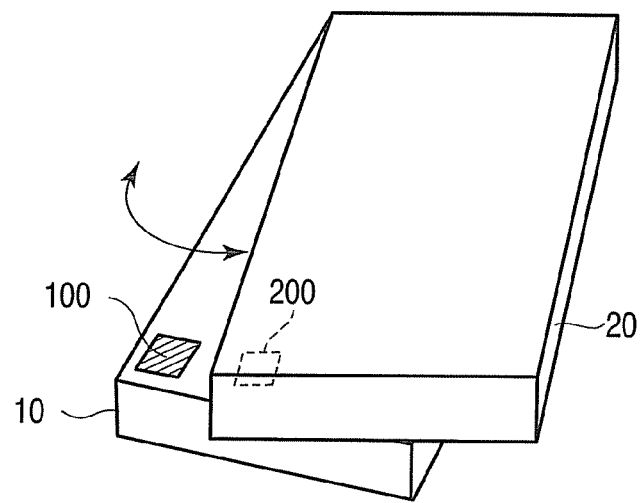
FIG. 21 is a schematic view depicting a configuration example when the sensor device of the first embodiment is applied to a mobile communication terminal.

FIG. 21 shows a rotary cellular phone. When the members 10, 20 rotate in an arrow direction and the areas 100, 200 come close to each other, the closed state of the members 10, 20 is detected.

Figure 22:
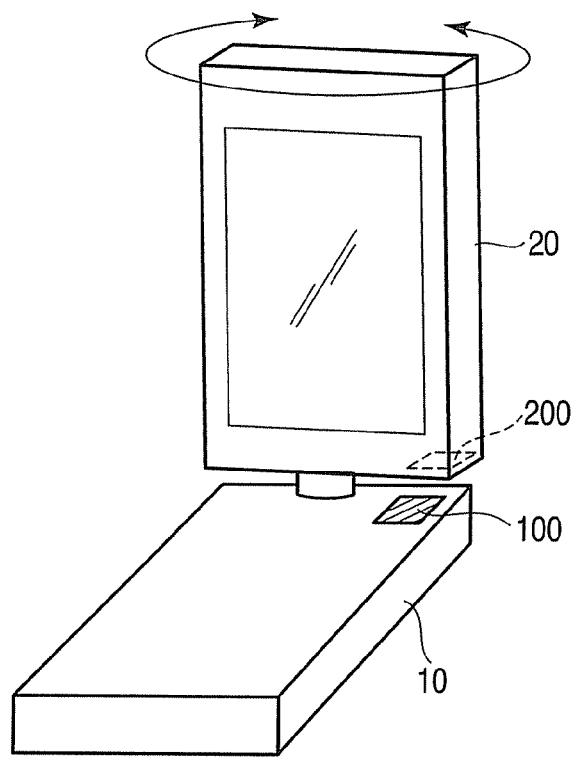
FIG. 22 is a schematic view depicting a configuration example when the sensor device of the first embodiment is applied to a mobile communication terminal.

FIG. 22 shows a rotary cellular phone. When the members 10, 20 rotate in an arrow direction and the areas 100, 200 come close to each other, the rotated states of the members 10, 20 are detected.

While the case in which the sensor device is applied to the opening/closing detection of the mobile communication terminal of the cellular phone, etc., has been described in detail, the sensor device may be applied to opening/closing detection of an electronic device such as a personal computer, a refrigerator, an oven range, i.e., a door other than that of a mobile communication terminal.

As mentioned above, in the embodiment, when the members 10, 20 are brought into a closed state, an electrical charge is induced at the installation part of the electrode 21 by the stored electrical charge at the installation part of the electrode 11, and an electrical charge is induced at the installation part of the electrode 22 which has been short-circuited to the electrode 21. Here, since the electrode 23 is grounded, the electrical charges differing from each other are stored at the installation parts of the electrodes 22, 23, respectively. Thereby, when the members 10, 20 are closed, the sensor device may induce electrical charges which are different from each other at the installation part of the electrodes 12, 13. That is, with the fluctuations of a positional relationship between the members 10, 20, when the electrodes 12, 22 come close to each other, and the electrodes 13, 23 come close to each other, the sensor device can induce electrical charges differing from each other at the installation parts of the electrodes 12, 13. Therefore, the sensor device can accurately detect the closed state of the members 10, 20 by means of a difference signal of the induced electrical charges.

When an object other than the electrodes 22, 23 comes close to the electrodes 12, 13, the electrical charges having the equivalent values are induced at the installation parts of the electrodes 12, 13. Thereby, there is no difference between the electrical charges induced at the installation parts of the electrode 12 and the electrical charge induced at the installation part of the electrode 13. Therefore, the sensor device may accurately detect solely the proximity of the electrodes 22, 23 to the electrodes 12, 13.

When the electrode 13 approaches the electrode 23, since the electrical charge at the installation part of the electrode 13 becomes almost zero, even if noise is present, the sensor device becomes able to find the difference between the electrical charge at the installation part of the electrode 13 and that of the electrode 12. Therefore, even if noise is present, the sensor device may accurately detect the open and closed state of the members 10, 20.

For concretely arranging electrodes, it is possible to arrange the electrodes 11, 12, 13 on the same plane, and to arrange the electrodes 21, 22, 23 on the same plane. Thereby, the sensor device may accurately detect the open and closed state without increasing the arrangement area of the electrodes. The member 20 does not need the circuit unit composed of the IC. Thereby, the arrangement area of the sensor device may be further reduced. Thus, according to the embodiment, the sensor device becomes able to accurately detect solely the proximity of the specified detection object with a compact configuration.

Second Embodiment

Referring now to FIG. 23, the second embodiment regarding the present invention will be described in detail. Since the sensor device of the embodiment has basically the same configuration as that of the first embodiment, the description will be omitted and components differing from those of the first embodiment will be described hereinafter.

FIG. 23 shows a schematic view depicting a configuration of the sensor device of the second embodiment regarding the invention. The sensor device shown in FIG. 23 detects a positional relationship between a first member (e.g., corresponding to the member 10 shown in FIGS. 1 and 2) and a second member (e.g., corresponding to the member 20 shown in FIGS. 1 and 2).

The first member 10 is provided with electrodes 11, 12, 13. At this time, the electrode 13 is arranged so as to surround the electrodes 11, 12. An alternating-current power source 30 is connected to the electrode 11 and the power source 30 supplies an electrical charge to the electrode 11.

The second member 20 is provided with electrodes 21, 22, 23. At this time, the electrode 23 is arranged so as to surround the electrodes 21, 22. The electrodes 21, 22 are short-circuited. The electrode 23 is grounded.

As mentioned above, in the second embodiment, the grounded electrode 23 is arranged so as to surround the electrodes 21, 22. Thereby, it becomes possible to prevent an electric field of the electrode 11 from leaking to the electrode 12.

Therefore, since it is able to decrease adverse effects from the electric field of the electrode 11 on the electrode 12, the sensor device may accurately detect the approaching of the member 10 to the member 20.

Third Embodiment

The following will describe the details of the third embodiment regarding the present invention by referring to FIG. 24. Since the sensor device of the embodiment has basically the same configuration as that of the first embodiment, the description will be omitted and only different components will be described.

FIG. 24 shows a schematic view illustrating a configuration of a sensor device of the third embodiment regarding the invention. The sensor device shown in FIG. 24 detects a positional relationship between a first member (e.g., corresponding to the member 10 shown in FIGS. 1 and 2) and a second member (e.g., corresponding to the member 20 shown in FIGS. 1 and 2).

Electrodes 11, 12, 13 are disposed adjacently to each other on the first member 10. An alternating-current power source 31 supplying an alternating signal with a first frequency f1 is connected to the electrode 11. An alternating-current power source 32 supplying an alternating signal with a second frequency f2 is connected to the electrode 12. Here, it is assumed that a difference between the first frequency f1 and the second frequency f2 is sufficiently smaller than frequencies f1, f2. A symbol R1 designates an input resistor.

When the first member 10 and the second member 20 becomes into a proximity state, the electrodes 12, 22 come close to each other. As a result, at an installation part of the electrode 12, a beat corresponding to the difference between the first frequency f1 and the second frequency f2 occurs.

A differential amplifier 40 is connected to the electrodes 12, 13. In a case of a proximity state of the members 10, 20, since a difference between a beat to be input to the amplifier 40 and the ground becomes larger than a fixed value, the amplifier 40 outputs a large difference signal. A beat detection unit 42 detects a beat frequency component of the difference signal output from the amplifier 40. The detection unit 42 consists of a low-pass filter (LPF) 421 and a comparator 422. The LPF 421 extracts the beat frequency component. If the value of the beat frequency component extracted by the LPF 421 is larger than a reference voltage value, the comparator 422 outputs a beat detection signal.

As mentioned above, in the third embodiment, when the electrodes 12, 22 come close to each other with fluctuations of the positional relationship between the members 10, 20, a difference signal having the beat frequency component occurs. Therefore, when the beat detection unit 42 detects the beat frequency component, the sensor device can accurately detect the positional relationship (open and closed state, etc.) between the first and the second members.

Since the sensor device detects the beat frequency component corresponding to the difference between the first and the second frequencies f1, f2, the sensor device becomes able to accurately detect solely the proximity of the electrode 21 to the electrode 22. Therefore, the sensor device can accurately detect solely the proximity of the specified detection object with a compact configuration.

A mechanism which applies amplitude modification to a carrier signal of a fixed frequency by a variable capacitance sensor, applies detection of an envelope of a signal, and detects an accelerated velocity is disclosed in Jpn. Pat. Appln. KOKAI publication No. 2003-43078. The mechanism requires a function that adjusts phases of the two signals. However, the configuration of the third embodiment regarding the invention detects the frequency difference as a beat which thus omits the need for a phase adjustment function.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sensor device which detects a positional relationship between an insulating first member and second member of which the surfaces face each other in coming close to each other, comprising:
   a first signal source generating an electrical signal;
   a first electrode disposed at a first part on a surface of the first member to receive the electrical signal and store an electrical charge at the first part;
   a second electrode which is disposed at a second part on a surface of the second member and is electrically floated so that the second electrode is directly connected to no voltage source, wherein the second electrode induces an electrical charge, corresponding to the electrical charge stored in the first part, at the second part when the first electrode approaches;
   a third electrode which is disposed at a third part on a surface of the second member, is electrically connected to the second electrode and is electrically floated so that the third electrode is also directly connected to no voltage source, wherein the third electrode induces an electrical charge, corresponding to the electrical charge induced at the second part, at the third part;
   a fourth electrode disposed at a fourth part on a surface of the first member and inducing an electrical charge, corresponding to the electrical charge induced at the third part, at the fourth part when the third electrode approaches;
   a reference electrode disposed at a fifth part on a surface of the second member to be connected to a reference voltage point;
   a fifth electrode disposed at a sixth part on a surface of the first member, and inducing an electrical charge, corresponding to the electrical charge to be stored in the fifth part, at the sixth part when the reference electrode approaches; and
   a differential amplifier amplifying a voltage difference between the fourth electrode and the fifth electrode and outputting a difference signal corresponding to the positional relationship.

2. A sensor system, comprising:
   a plurality of detection units, each including the sensor devices according to claim 1; and
   a generation unit configured to generate an output signal when the difference signals are output from all the detection units.

3. A sensor system, comprising:
   a plurality of detection units, each including the sensor devices according to claim 1; and
   a generation unit configured to generate an output signal in response to the difference signal to be output from at least one of the detection units.

4. The sensor device according to claim 1, wherein the differential amplifier, the first electrode, the fourth electrode and the fifth electrode are disposed on the same plane.

5. The sensor device according to claim 1, wherein the first electrode, the fourth electrode, the fifth electrode are disposed so as to cover at least a part of the differential amplifier.

6. The sensor device according to claim 1, wherein
   a plurality of first electrode groups each configured to include the first electrode, the fourth electrode and the fifth electrode are arranged from one end to other end of the first member;
   a plurality of second electrode groups each configured to include the second electrode, the third electrode and the reference electrode are arranged from one end to the other end of the second member; and
   the one end of the first member and the one end of the second member are connected to each other.

7. The sensor device according to claim 1, wherein
   the fifth electrode is disposed so as to surround a circumference of the first electrode and the fourth electrode; and
   the reference electrode is disposed so as to surround a circumference of the second electrode and the third electrode.

8. The sensor device according to claim 1, wherein
   the first signal source is an alternating-current power source which outputs an alternating-current signal of a frequency f1, and the sensor device further comprising:
   a second signal source supplying an alternating-current signal of a frequency f2 to the fourth electrode, wherein a difference between frequencies f1 and f2 is sufficiently smaller than the frequencies f1 and f2; and
   a beat detection unit configured to detect a beat frequency component corresponding to a difference between the frequencies f1, f2 from a difference signal to be output from the differential amplifier.

9. A sensor device, comprising:
   a first signal source generating an electrical signal;
   a first substrate including a first electrode which is disposed at a first part and receives the electrical signal to store a first electrical charge at the first part; a second electrode which is disposed at a second part and induces a second electrical charge at the second part; and a third electrode which is disposed at a third part and induces a third electrical charge at the third part;
   a second substrate including a fourth electrode which is disposed at a fourth part and is electrically floated so that the fourth electrode is directly connected to no voltage source, wherein the fourth electrode induces at the fourth part a fourth electrical charge corresponding to the first electrical charge stored in the first part, when the first electrode approaches; a fifth electrode which is disposed at a fifth part, is electrically connected to the fourth electrode and is electrically floated so that the fifth electrode is also directly connected to no voltage source, wherein the fifth electrode induces at the fifth part a fifth electrical charge corresponding to the electrical charge to be induced at the fourth part, wherein the second electrical charge corresponding to the fifth electrical charge to be induced at the fifth part is induced at the second part when the second electrode approaches at the fifth electrode; and a reference electrode which is disposed at a sixth part, and is connected to a reference voltage point to store a sixth electrical charge at the sixth part, wherein, the third electrical charge corresponding to the sixth electrical charge stored in the sixth part is induced at the third part when the third electrode approaches to the sixth electrode; and a differential amplifier amplifying a voltage difference between the second electrical charge stored in the second part and the third electrical charge stored in the third part to output a difference signal.

10. A sensor system, comprising:
a plurality of detection units each configured to include the sensor devices according to claim 9; and
a generation unit configured to generate an output signal when all the detection units output the difference signals.

11. A sensor system, comprising:
a plurality of detection units each configured to include the sensor devices according to claim 9; and
a generation unit configured to generate an output signal in response to the difference signal to be output from at least one of the detection units.

12. The sensor device according to claim 9, wherein the differential amplifier is disposed on the first substrate.

13. The sensor device according to claim 9, wherein the differential amplifier, the first electrode, the second electrode and the third electrode are disposed on the same plane.

14. The sensor device according to claim 9, wherein the first electrode, the second electrode and the third electrode are disposed so as to cover at least a part of the differential amplifier.

15. The sensor device according to claim 9, wherein the third electrode is disposed so as to surround a circumference of the first electrode and the second electrode; and the reference electrode is disposed so as to surround a circumference of the fourth electrode and the fifth electrode.

16. The sensor device according to claim 9, wherein
the first signal source is an alternating-current power source which outputs an alternating-current signal of a frequency f1; and the sensor device further comprising:

a second signal source supplying an alternating-current signal of a frequency f2 to the second electrode, wherein a difference between frequencies f1 and f2 is sufficiently smaller than the frequencies f1 and f2; and a beat detection unit configured to detect a beat frequency component corresponding to a difference between the frequencies f1, f2 from a difference signal to be output from the differential amplifier.

17. An electronic device, comprising a first member, a second member and a sensor device which detects a positional relationship between the first and the second members, wherein the sensor device comprises:
a first signal source generating an electrical signal;
a first electrode disposed at a first part on a surface of the first member to receive the electrical signal and store an electrical charge at the first part;
a second electrode which is disposed at a second part on a surface of the second member and is electrically floated so that the second electrode is directly connected to no voltage source, wherein the second electrode induces an electrical charge, corresponding to the electrical charge stored in the first part, at the second part when the first electrode approaches;
a third electrode which is disposed at a third part on a surface of the second member, is electrically connected to the second electrode and is electrically floated so that third electrode is also directly connected to no voltage source, wherein the third electrode induces an electrical charge, corresponding to the electrical charge induced at the second part, at the third part;
a fourth electrode disposed at a fourth part on a surface of the first member and inducing an electrical charge, corresponding to the electrical charge induced at the third part, at the fourth part when the third electrode approaches;
a reference electrode disposed at a fifth part on a surface of the second member to be connected to a reference voltage point;
a fifth electrode disposed at a sixth part on a surface of the first member, and inducing an electrical charge, corresponding to the electrical charge to be stored in the fifth part, at the sixth part when the reference electrode approaches; and
a differential amplifier amplifying a voltage difference between the fourth electrode and the fifth electrode and outputting a difference signal corresponding to the positional relationship.

* * * * *